US009548422B2

(12) United States Patent
Kim et al.

(10) Patent No.: US 9,548,422 B2
(45) Date of Patent: Jan. 17, 2017

(54) SEMICONDUCTOR LIGHT EMITTING DEVICE INCLUDING A PAD ELECTRODE SPACED APART FROM A TRANSPARENT ELECTRODE

(71) Applicant: SAMSUNG ELECTRONICS CO., LTD., Suwon-Si (KR)

(72) Inventors: Tae Hun Kim, Anyang-si (KR); Ki Seok Kim, Hwaseong-si (KR); Chan Mook Lim, Seongnam-si (KR); Tae Kang Kim, Yongin-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 56 days.

(21) Appl. No.: 14/454,612

(22) Filed: Aug. 7, 2014

(65) Prior Publication Data
US 2015/0108520 A1 Apr. 23, 2015

(30) Foreign Application Priority Data

Oct. 17, 2013 (KR) ........................ 10-2013-0123797

(51) Int. Cl.
*H01L 33/40* (2010.01)
*H01L 33/38* (2010.01)
*H01L 33/14* (2010.01)

(52) U.S. Cl.
CPC .............. *H01L 33/40* (2013.01); *H01L 33/38* (2013.01); *H01L 33/145* (2013.01)

(58) Field of Classification Search
CPC ........ H01L 33/145; H01L 33/20; H01L 33/30; H01L 33/36; H01L 33/387; H01L 33/40; H01L 33/405
See application file for complete search history.

(56) References Cited

U.S. PATENT DOCUMENTS

| 6,372,608 B1 | 4/2002 | Shimoda et al. |
| 6,645,830 B2 | 11/2003 | Shimoda et al. |
| (Continued) | | |

FOREIGN PATENT DOCUMENTS

| KR | 2004-0009309 A | 1/2004 |
| KR | 10-0805324 B1 | 2/2008 |
| (Continued) | | |

*Primary Examiner* — Daniel Whalen
*Assistant Examiner* — Suberr Chi
(74) *Attorney, Agent, or Firm* — Lee & Morse, P.C.

(57) ABSTRACT

A semiconductor light emitting device includes a light emitting structure and first and second electrodes. The light emitting structure includes first and second conductivity type semiconductor layers and an active layer interposed therebetween. The first and second electrodes are electrically connected to the first and second conductivity type semiconductor layers. The second electrode includes a current blocking layer, a reflective part disposed on the current blocking layer, a transparent electrode layer disposed on the second conductivity type semiconductor layer, a pad electrode part disposed within a region of the current blocking layer, and at least one finger electrode part disposed at least in part on the transparent electrode layer. The transparent electrode layer can be spaced apart from the reflective part, and have an opening surrounding the reflective part. In some examples, the transparent electrode layer can further be spaced apart from the current blocking layer.

17 Claims, 17 Drawing Sheets

(56) References Cited

U.S. PATENT DOCUMENTS

| | | |
|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,053,805 B2 | 11/2011 | Lim et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 2012/0153255 A1 | 6/2012 | Kim et al. |
| 2013/0049060 A1 | 2/2013 | Yu et al. |
| 2013/0307007 A1* | 11/2013 | Choi .............. H01L 33/405 257/98 |

FOREIGN PATENT DOCUMENTS

| | | |
|---|---|---|
| KR | 10-0907524 B1 | 7/2009 |
| KR | 10-1066286 B1 | 9/2011 |
| KR | 10-2012-0006257 A | 1/2012 |
| KR | 10-2012-0036572 A | 4/2012 |
| KR | 10-2012-0084563 A | 7/2012 |
| KR | 10-1169036 B1 | 7/2012 |
| KR | 10-2012-0122802 A | 11/2012 |
| KR | 10-1204430 B1 | 11/2012 |
| KR | 10-2012-0139128 A | 12/2012 |
| KR | 10-2013-0007034 A | 1/2013 |
| KR | 10-1223226 B1 | 1/2013 |
| KR | 2013-0007035 A | 1/2013 |
| KR | 2013-0011042 A | 1/2013 |
| KR | 10-2013-0036614 A | 4/2013 |

\* cited by examiner

SEMICONDUCTOR LIGHT EMITTING DEVICE INCLUDING A PAD ELECTRODE SPACED APART FROM A TRANSPARENT ELECTRODE

CROSS-REFERENCE TO RELATED APPLICATION

This application claims the benefit of Korean Patent Application No. 2013-0123797 filed on Oct. 17, 2013, with the Korean Intellectual Property Office, the disclosure of which is incorporated herein by reference.

BACKGROUND

The present disclosure relates to a semiconductor light emitting device.

A light emitting diode contains a light emitting material that emits light using electric energy by converting energy generated due to the recombination of electrons and electron holes into light. Such light emitting diodes are currently in widespread use as lighting elements, display devices, and light sources, and are undergoing rapid development.

In particular, with the commercialization of apparatuses such as cellular phone keypads, turn signal lamps, camera flashes, and the like, gallium nitride (GaN)-based light emitting diodes are undergoing rapid development. Additionally, new uses and applications for GaN-based light emitting diodes are being introduced, including use in general lighting devices. Applications and products using light emitting diodes are further expanding to applications in which high output and high efficiency are needed, such as in large scale TV backlight units, vehicle headlamps, general lighting devices, and the like. Therefore, methods for improving light extraction efficiency of light emitting devices employed for uses such as those described above are needed.

SUMMARY

An aspect of the present disclosure may provide a semiconductor light emitting device including a pad electrode spaced apart from a transparent electrode layer and having improved light extraction efficiency.

According to an aspect of the present disclosure, a semiconductor light emitting device may include a light emitting structure and first and second electrodes. The light emitting structure includes a first conductivity type semiconductor layer, an active layer, and a second conductivity type semiconductor layer sequentially stacked therein. The first and second electrodes are electrically connected to the first and second conductivity type semiconductor layers, respectively. The second electrode further includes a current blocking layer disposed in a region of an upper surface of the second conductivity type semiconductor layer; a reflective part disposed on the current blocking layer; a transparent electrode layer spaced apart from the reflective part, having an opening surrounding the reflective part, and disposed on the second conductivity type semiconductor layer; a pad electrode part spaced apart from the transparent electrode layer while covering the reflective part, and disposed within a region of the current blocking layer; and at least one finger electrode part extending from the pad electrode part in one direction and having at least one portion thereof disposed on the transparent electrode layer.

At least one portion of the transparent electrode layer may come into contact with the current blocking layer.

The pad electrode part may be spaced apart from a lateral surface of the opening in the transparent electrode layer by a predetermined distance.

The semiconductor light emitting device may further include a connection part electrically connecting the pad electrode part and the transparent electrode layer.

The connection part may have a predetermined length, and one end of the connection part may be disposed on the transparent electrode layer while the other end of the connection part may be disposed on the pad electrode part.

The connection part may be spaced apart from the finger electrode part adjacent thereto so as to extend from a point of the pad electrode part that is diametrically opposite from a point of the pad electrode part from which the finger electrode part extends.

The connection part may be one of a plurality of connection parts each electrically connecting the pad electrode part and the transparent electrode layer.

The connection parts of the plurality of connection parts and the finger electrode part may extend from respective points disposed evenly along the periphery of the pad electrode part.

The plurality of connection parts and the finger electrode part may be disposed in a radial manner around the pad electrode part.

The connection part may have a length shorter than a length of the finger electrode part.

The current blocking layer may be formed of at least one selected from a group consisting of $SiO_2$, $SiN$, $Al_2O_3$, $HfO$, $TiO_2$, and $ZrO$.

The reflective part may be formed of at least one selected from a group consisting of Ag, Al, Rh, and Ir.

The transparent electrode layer may be formed of at least one selected from a group consisting of indium tin oxide (ITO), zinc-doped indium tin oxide (ZITO), zinc indium oxide (ZIO), gallium indium oxide (GIO), zinc tin oxide (ZTO), fluorine-doped tin oxide (FTO), aluminum-doped zinc oxide (AZO), gallium-doped zinc oxide (GZO), $In_4Sn_3O_{12}$, and $Zn_{(1-x)}Mg_xO$ (Zinc Magnesium Oxide, $0 \leq x \leq 1$).

The pad electrode part and the finger electrode part may be formed of at least one selected from a group consisting of Au, W, Pt, Si, Ir, Ag, Cu, Ni, Ti, Cr, and Al.

According to another aspect of the present disclosure, a semiconductor light emitting device may include a light emitting structure and first and second electrodes. The light emitting structure includes a first conductivity type semiconductor layer, an active layer, and a second conductivity type semiconductor layer sequentially stacked therein. The first and second electrodes electrically connect to the first and second conductivity type semiconductor layers, respectively. The second electrode includes a current blocking layer disposed in a region of an upper surface of the second conductivity type semiconductor layer; a reflective part disposed on the current blocking layer; a transparent electrode layer spaced apart from the current blocking layer, having an opening surrounding the current blocking layer, and disposed on the second conductivity type semiconductor layer; a pad electrode part spaced apart from the transparent electrode layer while covering the reflective part, and disposed within a region of the current blocking layer; and at least one finger electrode part extending from the pad electrode part in one direction and having at least one portion thereof disposed on the transparent electrode layer.

The first electrode may be disposed in a portion of an upper surface of the first conductivity type semiconductor layer on which the active layer and the second conductivity type semiconductor layer are not disposed, and the first electrode may include a pad electrode part and a finger electrode part extending from the pad electrode part of the first electrode in a direction parallel to a length direction of the at least one finger electrode part of the second electrode.

The semiconductor light emitting device may further include a connection part electrically connecting the pad electrode part and the transparent electrode layer.

According to another aspect of the present disclosure, a semiconductor light emitting device may include a light emitting structure and first and second electrodes. The light emitting structure includes a first conductivity type semiconductor layer, an active layer, and a second conductivity type semiconductor layer sequentially stacked therein. The first and second electrodes are electrically connected to the first and second conductivity type semiconductor layers, respectively. The first electrode may include a plurality of first finger electrode parts disposed in a portion of an upper surface of the first conductivity type semiconductor layer on which the active layer and the second conductivity type semiconductor layer are not disposed. The second electrode may further include a current blocking layer disposed in a region of an upper surface of the second conductivity type semiconductor layer; a reflective part disposed on the current blocking layer; a transparent electrode layer spaced apart from the reflective part, having an opening surrounding the reflective part, and disposed on the second conductivity type semiconductor layer; a pad electrode part spaced apart from the transparent electrode layer while covering the reflective part, and disposed within a region of the current blocking layer; and at least one second finger electrode part extending from the pad electrode part, having at least one portion thereof disposed on the transparent electrode layer, and extending between the first finger electrode parts of the plurality of first finger electrode parts.

The transparent electrode layer may be spaced apart from the current blocking layer, and the opening in the transparent electrode layer may surround the current blocking layer.

The plurality of first finger electrode parts and the at least one second finger electrode part may each have an elongated shape that extends in parallel to one another.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
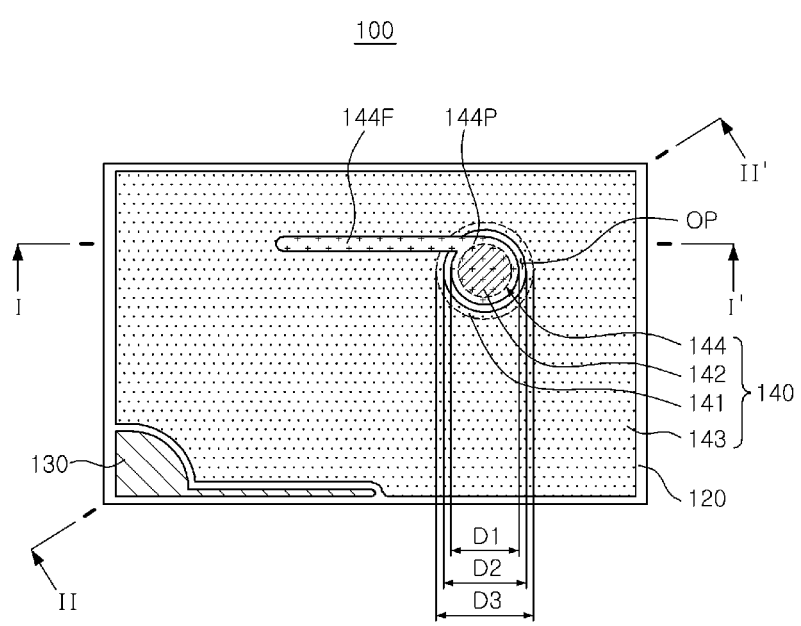
FIG. 1 is a plan view of a semiconductor light emitting device according to an exemplary embodiment of the present disclosure.

Exemplary embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Figure 2:
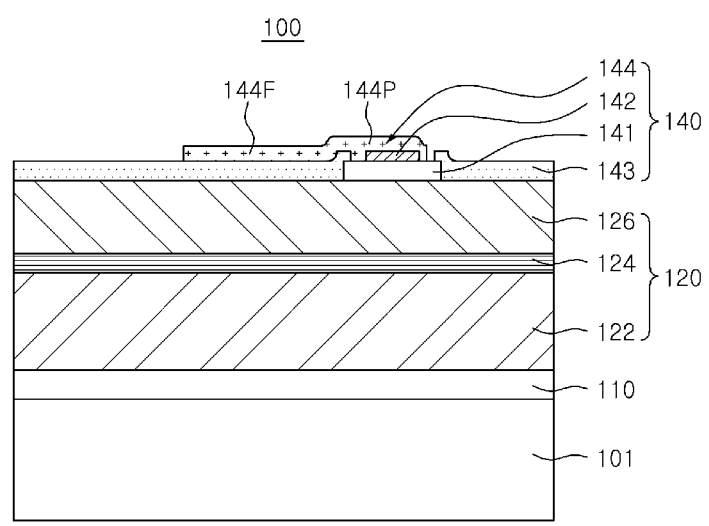
FIG. 2 is a side cross-sectional view of the semiconductor light emitting device of FIG. 1, taken along line I-I'.
Figure 3:
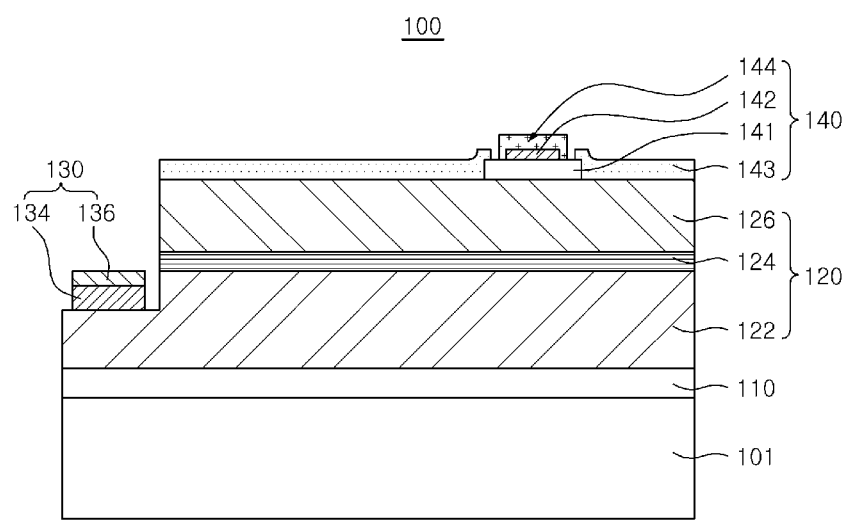
FIG. 3 is a side cross-sectional view of the semiconductor light emitting device of FIG. 1, taken along line II-II'.
Figure 4:
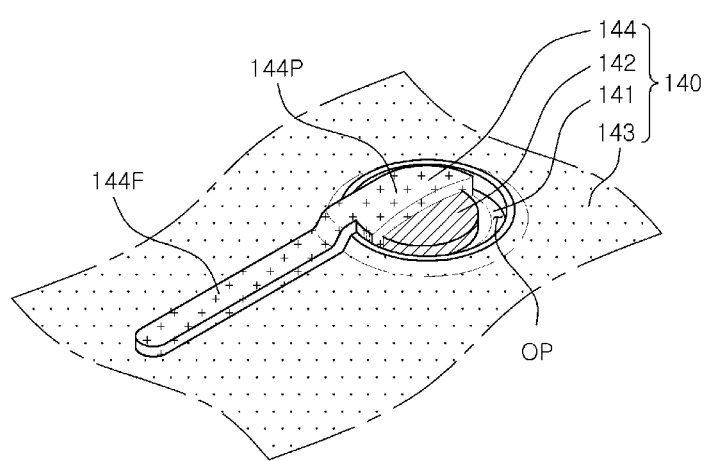
FIG. 4 is a partially cut-away perspective view of a second electrode part of FIG. 1.

FIG. 1 is a plan view of a semiconductor light emitting device according to an exemplary embodiment of the present disclosure. FIG. 2 is a side cross-sectional view of the semiconductor light emitting device of FIG. 1, taken along line I-I'. FIG. 3 is a side cross-sectional view of the semiconductor light emitting device of FIG. 1, taken along line II-II'. FIG. 4 is a partially cut-away perspective view of a second electrode part of FIG. 1.

Referring to FIGS. 1 through 3, a semiconductor light emitting device 100 according to an exemplary embodiment of the present disclosure may include a light emitting structure 120 and first and second electrodes 130 and 140.

The light emitting structure 120 may include first and second conductivity type semiconductor layers 122 and 126 and an active layer 124 disposed between the first and second conductivity type semiconductor layers 122 and 126. In response to applying electrical power to the first and second conductivity type semiconductor layers 122 and 126, light may be emitted from the active layer 124.

By way of example, the light emitting structure 120 may include a nitride semiconductor layer, and the first conductivity type semiconductor layer 122 may include an n-type semiconductor layer while the second conductivity type semiconductor layer 126 may include a p-type semiconductor layer.

The n-type semiconductor layer and the p-type semiconductor layer may be formed of a semiconductor material having a composition of $Al_xIn_yGa_{1-x-y}N$ and doped with an n-type impurity and a p-type impurity, respectively. Representatively, GaN, AlGaN, and InGaN may be used. In this case, x and y values are within a range of $0 \leq x \leq 1$, $0 \leq y \leq 1$, and $0 \leq x+y \leq 1$.

In addition, representatively, the n-type impurity may be Si, Ge, Se, Te, C, or the like and the p-type impurity may be Mg, Zn, Be, or the like.

In the present embodiment, the first and second conductivity type semiconductor layers 122 and 126 may be a GaN layer, and the first conductivity type semiconductor layer 122 may be formed of n-GaN while the second conductivity type semiconductor layer 126 may be formed of p-GaN.

The light emitting structure 120 may be grown on a substrate 101 using metal organic chemical vapor deposition (MOCVD), molecular beam epitaxy (MBE), hydride vapor phase epitaxy (HYPE), or the like. The substrate 101 may be formed of sapphire, silicon carbide (SiC), silicon (Si), $MgAl_2O_4$, MgO, $LiAlO_2$, $LiGaO_2$, or GaN, but is not limited thereto. In the present embodiment, a sapphire substrate may be used.

Sapphire may be a crystal having Hexa-Rhombo R3c symmetry. The sapphire may have a lattice constant of 13.001 Å in a C-axis direction and a lattice constant of 4.758 Å in an A-axis direction and may include a C (0001) plane, an A (11-20) plane, an R (1-102) plane, and the like. In this case, the C plane is mainly used as a nitride growth substrate because the C plane relatively facilitates the growth of a nitride film and is stable at high temperatures.

In addition, a buffer layer 110 may be further provided on a lower portion of the first conductivity type semiconductor layer 122, for example between the first conductivity type semiconductor layer 122 and the substrate 101.

The buffer layer 110 is provided to alleviate or reduce the incidence of lattice defects in the light emitting structure 120 grown on the substrate 101, and may be formed of an undoped semiconductor layer including a nitride and the like. By way of example, the buffer layer 110 may alleviate a difference in lattice constants between the sapphire substrate used as the substrate 101 and the light emitting structure 120 stacked on an upper surface of the substrate 101 and formed of GaN to thereby enhance crystalline properties of the GaN layer. The buffer layer 110 may be formed of undoped GaN, AlN, and InGaN, or the like and may be grown to have a thickness of several tens through several hundreds of Å at a low temperature of 500° C. to 600° C. Here, the term "undoped" indicates that a separate impurity doping process has not been performed on a semiconductor layer, and an impurity concentration inherently present in the semiconductor layer may be present. For example, in a case in which a gallium nitride semiconductor is grown using metal organic chemical vapor deposition (MOCVD), silicon (Si) or the like, which is sometimes used as a dopant, may be included in a background concentration of about $10^{14}$ to $10^{18}/cm^3$.

The active layer 124 may be a layer for emitting visible light having a wavelength in a range of about 350 nm to 680 nm, and may be configured of an undoped nitride semiconductor layer having a single or multiple quantum well (MQW) structure. The active layer 124 may have a multiple quantum well (MQW) structure in which quantum barrier and quantum well layers are alternately stacked. By way of example, the active layer 124 may be formed to have a multiple quantum well (MQW) structure in which quantum barrier and quantum well layers having a composition of $Al_xIn_yGa_{1-x-y}N$ ($0 \leq x \leq 1$, $0 \leq y \leq 1$, $0 \leq x+y \leq 1$) are alternately stacked to thereby have a predetermined band gap, whereby electrons and holes are recombined due to the quantum barrier to thereby emit light.

The first and second electrodes 130 and 140 may be formed on the first and second conductivity type semiconductor layers 122 and 126, respectively. The first and second electrodes 130 and 140 may be electrically connected to the first and second conductivity type semiconductor layers 122 and 126, respectively, to enable light to be emitted from the active layer 124 of the light emitting structure 120 when power is applied to the electrodes.

In addition, the first and second electrodes 130 and 140 may be provided as regions in contact with a conductive wire, a solder bump, or the like, for applying an external electrical signal thereto. The first electrode 130 may be disposed on an upper surface of a portion of the first conductivity type semiconductor layer 122, exposed by partially removing the active layer 124 and the second conductivity type semiconductor layer 126, in the light emitting structure 120. The first electrode 130 may be disposed along an edge of the light emitting structure 120 on the exposed upper surface of the first conductivity type semiconductor layer 122, in order to further efficiently disperse current. The first electrode 130 may include a pad electrode part and a finger electrode part extending from the pad electrode part. As shown in FIG. 1, the finger electrode part may extend in a length direction of the light emitting structure 120, for example along an edge portion of the light emitting structure 120.

The first electrode 130 may include a first reflective part 134 and a first electrode part 136. The first reflective part 134 may serve to prevent light emitted from the active layer 124 from being absorbed in an electrode region, and may be formed of a single layer or multiple layers of a conductive material having ohmic-characteristics with the first conductivity type semiconductor layer 122. For example, the first reflective part 134 may include one of Ag, Al, Rh, and Ir and may be an alloy of at least one selected from a group consisting of Mg, Zn, Sc, Hf, Zr, Te, Se, Ta, W, Nb, Cu, Si, Ni, Co, Mo, Cr, Mn, Hg, Pr and La, and Ag or Al.

The first electrode part 136 may be a region in contact with a conductive wire, a solder bump, or the like, and may include at least one of Au, W, Pt, Si, Ir, Ag, Cu, Ni, Ti, Cr, Al, and the like, and an alloy thereof, but may include a material different from that of the first reflective part 134.

The second electrode 140 may include a current blocking layer 141, a second reflective part 142 formed on the current blocking layer 141, a transparent electrode layer 143 having an opening OP formed therein and surrounding the second reflective part 142, and a second electrode part 144 covering the second reflective part 142.

The current blocking layer 141 may be disposed in a region of an upper surface of the second conductivity type semiconductor layer 126. The current blocking layer 141 may include an insulating material, and for example, may include one of $SiO_2$, SiN, $Al_2O_3$, HfO, $TiO_2$, and ZrO. The current blocking layer 141 may prevent electrical signals applied from the second electrode part 144 to be immediately introduced into an upper portion of the light emitting structure 120, to thereby reduce a phenomenon in which the electrical signals are concentrated on a lower portion of the second electrode part 144, such that current spreading may be efficiently performed.

By way of example, as illustrated in FIG. 1, the current blocking layer 141 may have a circular shape having a diameter of D3 when viewed from the upper surface of the second conductivity type semiconductor layer 126, and may only be formed below a pad electrode part 144P, but is not limited to being formed as described above. The current blocking layer 141 may be variously shaped, such as being formed below a finger electrode part 144F to extend along the finger electrode part 144F.

The second reflective part 142 may be formed on the current blocking layer 141, but may only be formed on an upper portion of the current blocking layer 141 so as not to be in contact with the second conductivity type semiconductor layer 126. By way of example, the second reflective part 142 may have a circular shape having a diameter D1 smaller than the diameter D3 when viewed from the upper surface of the second conductivity type semiconductor layer 126, but is not limited to being formed as described above. The second reflective part 142 on the current blocking layer 141 may be variously shaped.

In a similar manner to the first reflective part 134, the second reflective part 142 may reflect light emitted from the active layer 124 without the absorption thereof, thereby allowing for an improvement in external light extraction efficiency of the semiconductor light emitting device 100. A surface of the second reflective part 142 may be processed to be smooth in order to improve surface reflectance, and may have unevenness structures formed thereon in order to have a predetermined degree of surface reflectance.

The second reflective part 142 may include one of Ag, Al, Rh, and Ir and may be an alloy of at least one selected from a group consisting of Mg, Zn, Sc, Hf, Zr, Te, Se, Ta, W, Nb, Cu, Si, Ni, Co, Mo, Cr, Mn, Hg, Pr, and La, and Ag or Al. In addition, titanium (Ti) may be deposited on an upper portion of the second reflective part 142 to thereby prevent oxidation of the second reflective part 142.

The second reflective part 142 may be formed within the opening OP while being spaced apart from a lateral surface of the opening OP by a predetermined distance (e.g., spaced apart from the transparent electrode layer 143). In a case in which the second reflective part 142 comes into contact with the transparent electrode layer 143, the transparent electrode layer 143 may be discolored to thereby lead to deterioration in external light extraction efficiency of light emitted from the active layer 124. Therefore, in a case in which the second reflective part 142 may be spaced apart from the lateral surface of the opening OP by a predetermined distance so as not to be in contact with the transparent electrode layer 143, the discoloring of the transparent electrode layer 143 may be prevented, such that external light extraction efficiency of the semiconductor light emitting device 100 may be improved.

The transparent electrode layer 143, a current spreading layer, may be formed on the upper surface of the second conductivity type semiconductor layer 126. The transparent electrode layer 143 may be formed as a transparent conductive oxide layer and may be formed of a material selected from a group consisting of indium tin oxide (ITO), zinc-doped indium tin oxide (ZITO), zinc indium oxide (ZIO), gallium indium oxide (GIO), zinc tin oxide (ZTO), fluorine-doped tin oxide (FTO), aluminum-doped zinc oxide (AZO), gallium-doped zinc oxide (GZO), $In_4Sn_3O_{12}$, and $Zn_{(1-x)}Mg_xO$ (Zinc Magnesium Oxide, $0 \leq x \leq 1$).

The transparent electrode layer 143 may have the opening OP formed in at least one region thereof, and an upper surface of the current blocking layer 141 may be exposed to or in contact with a bottom surface of the opening OP. In this case, at least one portion of the transparent electrode layer 143 may be formed to be in contact and overlapping with the current blocking layer 141. By way of example, as illustrated in FIG. 1, the opening OP may be formed to have a circular shape having a diameter D2 smaller than the diameter D3 of the current blocking layer 141, but is not limited to being formed as described above. The opening OP may be variously formed.

The second electrode part 144 may be spaced apart from the transparent electrode layer 143 by a predetermined distance so as not to be in contact with the transparent electrode layer 143, while covering the second reflective part 142. The second electrode part 144 may be formed of at least one selected from a group consisting of Au, W, Pt, Si, Ir, Ag, Cu, Ni, Ti, Cr, and Al and may have a multilayer structure. The second electrode part 144 may be configured of the pad electrode part 144P and the finger electrode part 144F. The pad electrode part 144P may be a region formed to be spaced apart from the transparent electrode layer 143 while covering the second reflective part 142. The finger electrode part 144F may be formed to extend from the pad electrode part 144P in one direction, and at least one portion thereof may be formed on the transparent electrode layer 143. The finger electrode part 144F may have a width narrower than and a length greater than those of the pad electrode part 144P. The finger electrode part 144F may thereby reduce a phenomenon in which electrical signals are concentrated on a lower portion of the pad electrode part 144P due to the electrical signals applied from the second electrode part 144, such that current spreading may be efficiently performed.

In the semiconductor light emitting device 100 as configured above, since the pad electrode part 144P may be formed on the current blocking layer 141, and the pad electrode part 144P and the transparent electrode layer 143 are spaced apart from each other, the pad electrode part 144P may be electrically insulated from the second conductivity type semiconductor layer 126. Therefore, since electrical signals directly applied to the second conductivity type semiconductor layer 126 may be blocked by the pad electrode part 144P, a phenomenon in which electrical signals are only applied to a lower region of the pad electrode part 144P may be basically prevented. The electrical signals applied to the pad electrode part 144P may be applied to the transparent electrode layer 143 through the finger electrode part 144F, and are then widely spread on an upper portion of the second conductivity type semiconductor layer 126. Thus, the semiconductor light emitting device 100 may enable further efficient current spreading as compared to a semiconductor light emitting device according to the related art.

Figure 9:
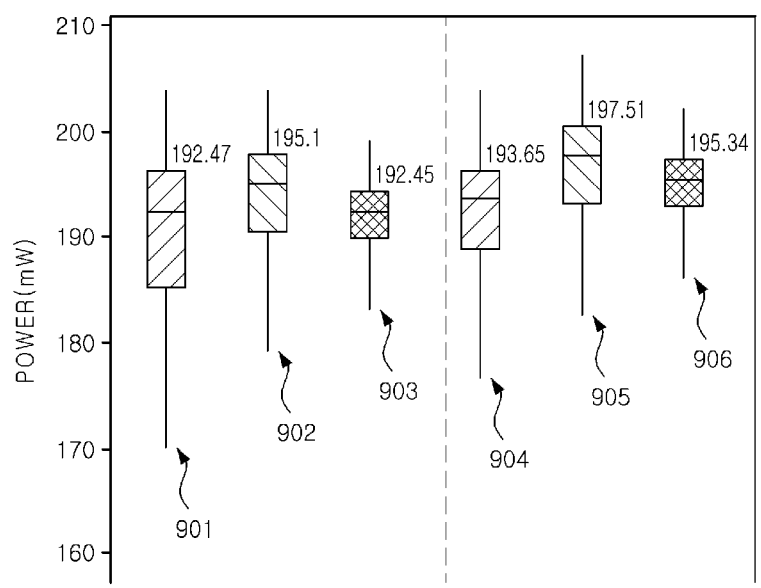
FIG. 9 is a graph illustrating effects of the semiconductor light emitting device according to the exemplary embodiment of the present disclosure.

With reference to FIG. 9, effects of the semiconductor light emitting device according to the exemplary embodiment of the present disclosure will be described. FIG. 9 is a graph illustrating a comparison result between luminance values 904, 905, and 906 of semiconductor light emitting devices in which the pad electrode part and the transparent electrode layer are separated from each other and luminance values 901, 902, and 903 of semiconductor light emitting devices in which the pad electrode part and the transparent electrode layer come into contact with each other. The luminance values 901 and 904, the luminance values 902 and 905, and the luminance values 903 and 906 are respective luminance values of the semiconductor light emitting devices having differences only in terms of constitutions of the pad electrode part and the transparent electrode layer, and the semiconductor light emitting devices were manufactured through the same manufacturing process.

With reference thereto, in a case in which the pad electrode part and the transparent electrode layer are separated from each other, such that an electrical signal is only applied through the finger electrode part, it could be confirmed that luminance values were improved by about 0.6%, 1.2% and 1.5%, respectively, as compared to a case in which an electrical signal is applied through the pad electrode part.

Figure 8:
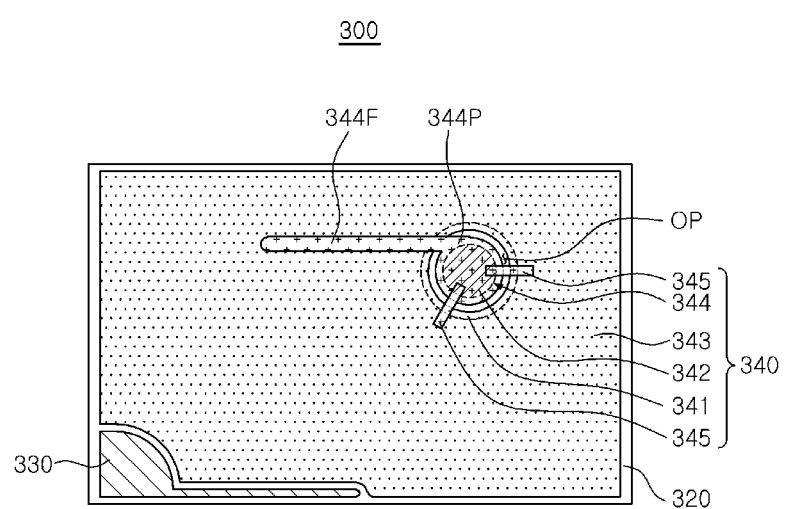
FIG. 8 is a plan view illustrating a modified example of the semiconductor light emitting device of FIG. 1.

Then, referring to FIG. 8, a modified example of the semiconductor light emitting device of FIG. 1 will be described. The modified example is different from the foregoing embodiment in that a connection part 345 electrically connecting a pad electrode part 344P and a transparent electrode layer 343 may be further provided. Other configurations thereof are identical to those of the foregoing embodiment and thus, a configurations thereof, different from the foregoing embodiment will be mainly be described hereinafter.

The connection part 345 may be formed to have a predetermined length and may have a narrow, elongated shape, in a similar manner to that of a finger electrode part 344F. However, the connection part 345 may have a length shorter than that of the finger electrode part 344F. One end of the connection part 345 may be disposed on the transparent electrode layer 343 and the other end of the connection part 345 may be disposed on the pad electrode part 344P to thereby electrically connect the pad electrode part 344P and the transparent electrode layer 343.

The connection part 345 may be configured to supply an electrical signal to the circumference of the opening OP of the transparent electrode layer 343 formed in the vicinity of the pad electrode part 344P to thereby further improve current spreading. In a case in which the connection part 345 may be further provided in the semiconductor light emitting device according to the foregoing embodiment, current spreading may be further efficiently performed.

The connection part 345 may be spaced apart from the finger electrode part 344F adjacent thereto and may further improve current spreading in a region in which the finger electrode part 344F is not disposed. In one example, the connection part 345 is spaced apart from the finger electrode part 344F so as to extend from a point of the pad electrode part 344P that is diametrically opposite from a point of the pad electrode part 344P from which the finger electrode part 344F extends, such that the connection part 345 and the finger electrode part 344F are spaced apart by a maximum distance, thereby enhancing current spreading effects. In addition, a plurality of connection parts 345 may be provided, and in this case, the plurality of connection parts 345 may be disposed in a radial manner around the pad electrode part 344P. In a case in which the plurality of connection parts 345 are provided, the respective connection parts 345 may be spaced apart from the finger electrode part 344F adjacent thereto or another connection part 345 adjacent thereto by a maximum distance, thereby enhancing current spreading effects. In this case, the respective connection parts among the plurality of connection parts 345 may be spaced apart from the finger electrode part 344F adjacent thereto or another connection part 345 adjacent thereto by the same distance, or may extend radially outwards from the pad electrode part 344P at evenly spaced angles from each other. For example, the connection parts 345 and the finger electrode part 344F may extend from respective points disposed evenly along the periphery of the pad electrode part 344P, such that the connection parts 345 and the finger electrode part 344F are spaced apart by a maximum distance, thereby enhancing current spreading effects.

In more detail, in a case in which a single finger electrode part 344F and a single connection part 345 are formed, the connection part 345 may be disposed on the opposite side of the finger electrode part 344F in order to form an angle of 180 degrees with respect to the finger electrode part 344F. In addition, in a case in which a single finger electrode part 344F and two connection parts 345 are formed, the two connection parts 345 may be respectively disposed to form an angle of 120 degrees with respect to the finger electrode part 344F.

The connection part 345 may be formed of at least one selected from a group consisting of Au, W, Pt, Si, Ir, Ag, Cu, Ni, Ti, Cr, and Al and may have a multilayer structure.

Then, another modified example of the semiconductor light emitting device of FIG. 1 will be described with reference to FIG. 10, and improved effects will be described with reference to FIGS. 11A to 11C.

Another modified example is different from the foregoing embodiment in that a plurality of finger electrode parts 444F of a second electrode part 444 are extended from a pad electrode part 444P thereof. However, the number of the finger electrode parts 444F is not limited to the example illustrated in FIG. 10, and may be variously changed according to embodiments. Configurations of a current blocking layer 441, a reflective part 442 formed on the current blocking layer 441, and a transparent electrode part 443 having the opening OP formed therein and surrounding the reflective part 442 are identical to those of the foregoing embodiment and thus, configurations thereof, different from the foregoing embodiment will be mainly described hereinafter.

The plurality of finger connection parts 444F may each respectively have a narrow, elongated shape, and may be formed in parallel with one another in a length direction of a semiconductor light emitting device 400. First electrodes 430 may include finger electrode parts having narrow, elongated shapes and may be alternatively disposed between the finger electrode parts 444F.

Figure 10:
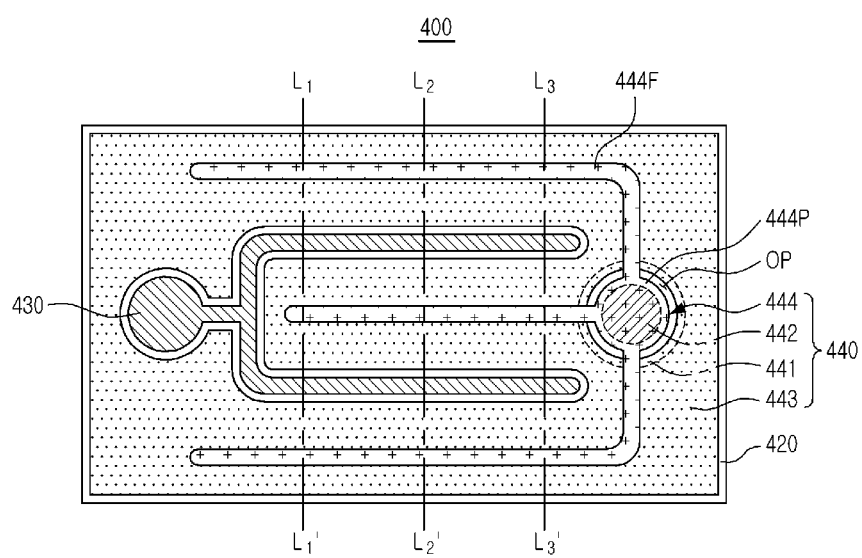
FIG. 10 is view illustrating another modified example of the semiconductor light emitting device of FIG. 1.
Figure 11A:
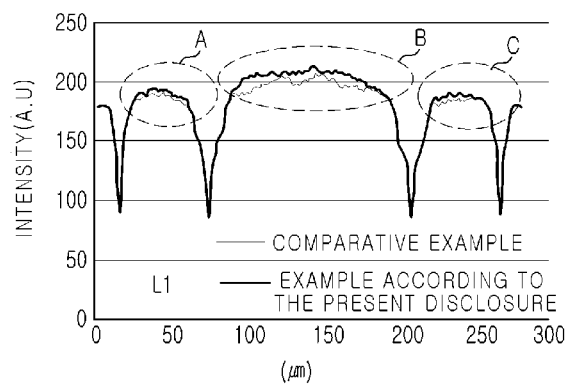
FIGS. 11A to 11C are graphs illustrating results of comparisons of quantities of light emitted by the semiconductor light emitting device illustrated in FIG. 10 and a comparative example.
Figure 11B:
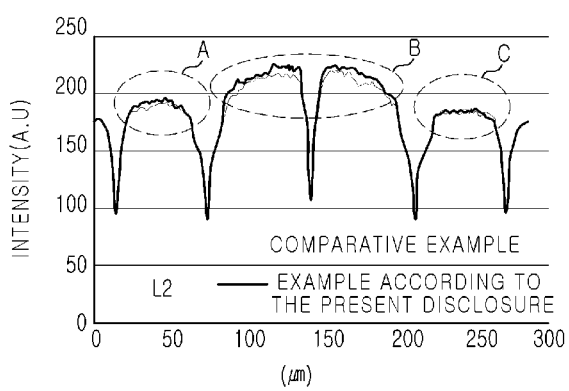
Figure 11C:
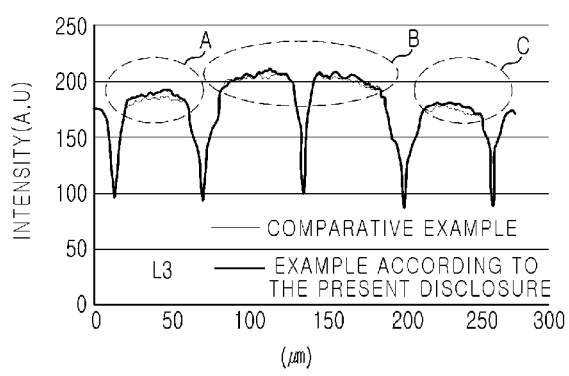

With reference to FIGS. 10 and 11A to 11C, effects according to another modified example described above and a comparative example will be compared. FIGS. 11A to 11C are graphs illustrating comparison results in light quantities of another modified example described above and the comparative example. The comparative example is different from another modified example described above in that the pad electrode part 444P and the transparent electrode part 443 are disposed to be in contact with each other, and other configurations thereof are identical to those of another modified example described above.

FIG. 11A is a graph illustrating a quantity of light measured in the semiconductor light emitting device 400 of FIG. 10, taken along line $L_1$-$L_1'$, FIG. 11B is a graph illustrating a quantity of light measured in the semiconductor light emitting device 400 of FIG. 10, taken along line $L_2$-$L_2'$, and FIG. 11C is a graph illustrating a quantity of light measured in the semiconductor light emitting device 400 of FIG. 10, taken along line $L_3$-$L_3'$. With reference to A, B, and C regions in the respective graphs, it could be confirmed that in the embodiment of the present disclosure, the quantity of light was increased overall in almost all regions, as compared to the case of the comparative example. In consideration of the result as described above, it could be confirmed that current spreading may be further efficiently performed when the pad electrode part 444P and the transparent electrode part 443 are spaced apart from each other.

Figure 5:
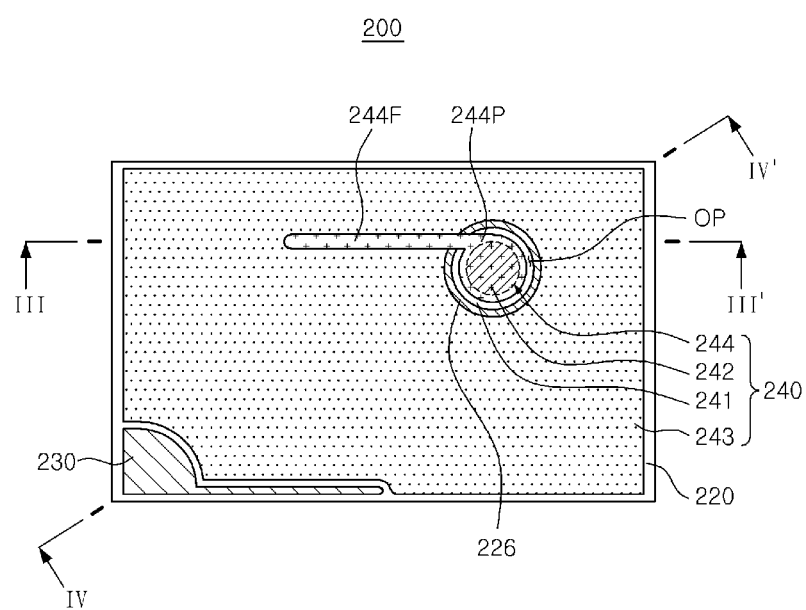
FIG. 5 is a plan view of a semiconductor light emitting device according to another exemplary embodiment of the present disclosure.
Figure 6:
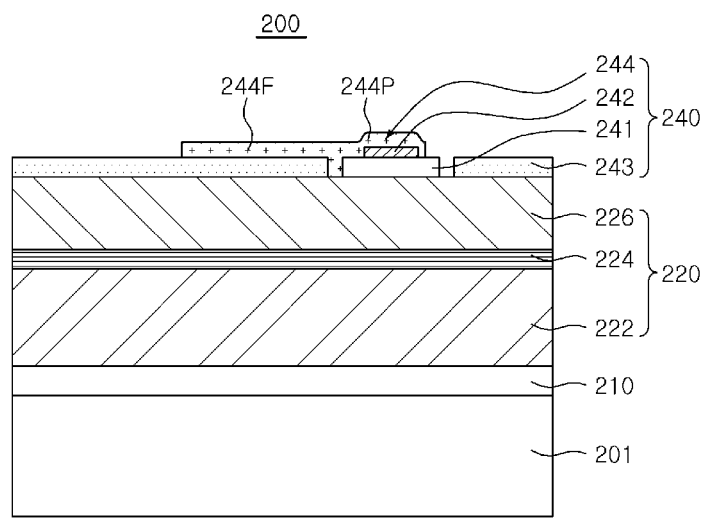
FIG. 6 is a side cross-sectional view of the semiconductor light emitting device of FIG. 5, taken along line III-III'.
Figure 7:
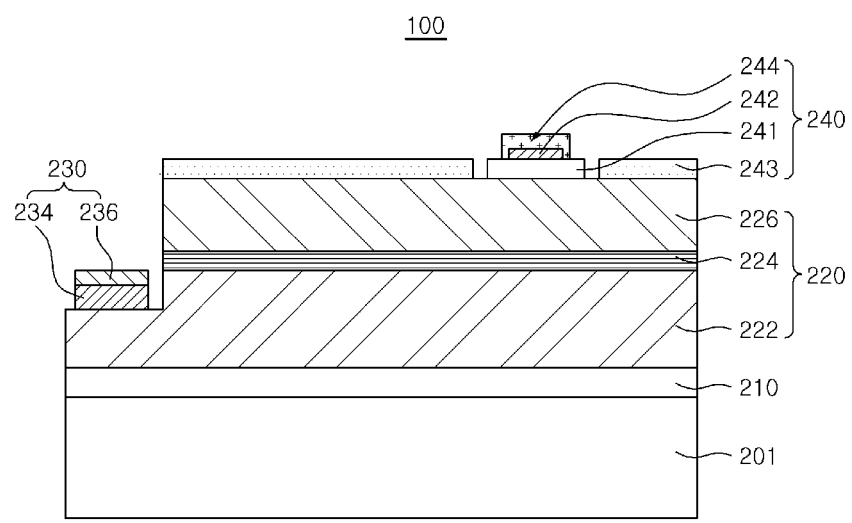
FIG. 7 is a side cross-sectional view of the semiconductor light emitting device of FIG. 5, taken along line IV-IV'.

Next, a semiconductor light emitting device 200 according to another exemplary embodiment of the present disclosure will be described with reference to FIGS. 5 to 7. FIG. 5 is a plan view of a semiconductor light emitting device according to another exemplary embodiment of the present disclosure. FIG. 6 is a side cross-sectional view of the semiconductor light emitting device of FIG. 5, taken along line III-III'. FIG. 7 is a side cross-sectional view of the semiconductor light emitting device of FIG. 5, taken along line IV-IV'.

The present embodiment is different from the foregoing embodiments in that a current blocking layer 241 and a transparent electrode layer 243 are disposed to be spaced apart from each other. Other configurations thereof are identical to those of the foregoing embodiments and thus, configurations thereof different from the foregoing embodiments will be mainly described hereinafter.

As illustrated in FIGS. 5 and 6, the semiconductor light emitting device 200 according to another exemplary embodiment of the present disclosure may include first and second conductivity type semiconductor layers 222 and 226, an active layer 224, and first and second electrodes 230 and 240.

The second electrode 240 may include a current blocking layer 241, a reflective part 242 formed on the current blocking layer 241, a transparent electrode layer 243 having the opening OP formed therein and surrounding the reflective part 242, and a second electrode part 244 covering the reflective part 242.

As described above, the current blocking layer 241 may be formed in a region of the second conductivity type semiconductor layer 226.

The opening OP may be formed in at least one region of the transparent electrode layer 243, while a lateral surface of the opening OP may be spaced apart from the current blocking layer 241, such that the transparent electrode layer 243 and the current blocking layer 241 may not be in contact with each other.

Similar to the exemplary embodiment described above, the reflective part 242 may be formed on the current blocking layer 241, and a pad electrode part 244P may be formed to be spaced apart from the transparent electrode layer 243 while covering the reflective part 242.

Therefore, in comparison with the foregoing embodiment, the current blocking layer 241 and the transparent electrode layer 243 are disposed to be spaced apart from each other in the present embodiment.

In this manner, when the current blocking layer 241 and the transparent electrode layer 243 are spaced apart from each other, insulation between the reflective part 242 formed on the current blocking layer 241 and the transparent electrode layer 243 may be further improved.

In addition, since it may not necessary to form an overlap region between the current blocking layer 241 and the transparent electrode layer 243, an area of the opening OP in the transparent electrode layer 243 may be further increased in the present embodiment as compared to the foregoing embodiments, such that an area of the reflective part 242 disposed within the opening OP may be further increased. Moreover, in a case in which the area of the reflective part 242 is increased, reflectivity of the semiconductor light emitting device 200 may be increased, such that external light extraction efficiency thereof may be further improved.

Further, as described above, in a case in which the reflective part 242 comes into contact with the transparent electrode layer 243, the transparent electrode layer 243 may be discolored to thereby lead to deterioration in light transmissivity. Therefore, the reflective part 242 may be spaced apart from the transparent electrode layer 243 so as not to be in contact therewith. In the semiconductor light emitting device 200 according to the present embodiment, since a contact region between the transparent electrode layer 243 and the current blocking layer 241 may not be formed, a possibility that the reflective part 242 will come into contact with the transparent electrode layer 243 to thereby result in the discoloring of the transparent electrode layer 243 may be lowered, such that reliability of the semiconductor light emitting device 200 may be further increased.

Figure 12:
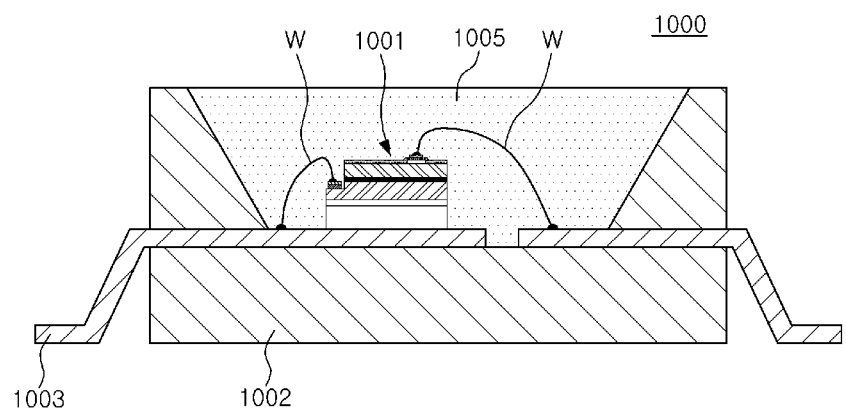
FIGS. 12 and 13 are views each illustrating examples of applying the semiconductor light emitting device according to the exemplary embodiment of the present disclosure to a package.
Figure 13:
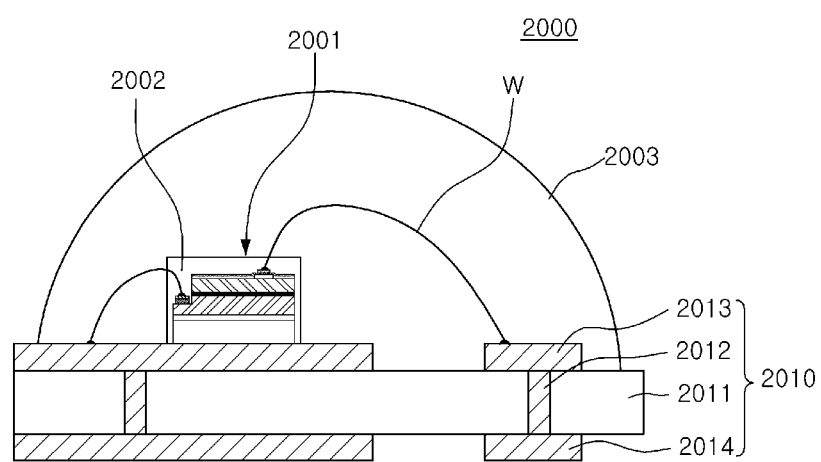

FIGS. 12 and 13 are views each illustrating an example of applying the semiconductor light emitting device according to the exemplary embodiment of the present disclosure to a package.

Referring to FIG. 12, a semiconductor light emitting device package 1000 includes a semiconductor light emitting device 1001, a package body 1002, and a pair of lead frames 1003. The semiconductor light emitting device 1001 may be mounted on the lead frame 1003 to be electrically connected thereto through a wire W. According to embodiments, the semiconductor light emitting device 1001 may be mounted on another portion of the package 1000 rather than the lead frame 1003, for example, on the package body 1002. The package body 1002 may have a cup shape formed therein in order to improve light reflection efficiency, and such a reflective cup may be filled with a sealing portion 1005 including a light transmissive material in order to encapsulate the semiconductor light emitting device 1001 and the wire W. In the embodiment, the semiconductor light emitting device package 1000 may include any one of the semiconductor light emitting devices of FIGS. 1 to 8 and 10.

Referring to FIG. 13, a semiconductor light emitting device package 2000 includes a semiconductor light emitting device 2001, a mounting board 2010, and a sealing portion 2003. In addition, a wavelength conversion part 2002 may be formed on upper and side surfaces of the semiconductor light emitting device 2001. The semiconductor light emitting device 2001 may be mounted on the mounting board 2010 and electrically connected thereto through a wire W.

The mounting board 2010 may include a substrate body 2011, an upper surface electrode 2013, and a lower surface electrode 2014. In addition, the mounting board 2010 may also include a through electrode 2012 connecting the upper surface electrode 2013 and the lower surface electrode 2014. The mounting board 2010 may be provided as a board such as PCB, MCPCB, MPCB, FPCB, or the like, and a structure thereof may be used in various manners.

The wavelength conversion part 2002 may include fluorescent materials or quantum dots. The sealing portion 2003 may have a convex lens shape in which an upper surface thereof is upwardly convex, but may have a concave lens shape according to embodiments, whereby an orientation angle of light emitted through an upper surface of the sealing portion 2003 may be controlled.

In the embodiment, the semiconductor light emitting device package 2000 may include any one of the semiconductor light emitting devices of FIGS. 1 to 8 and 10.

Figure 14:
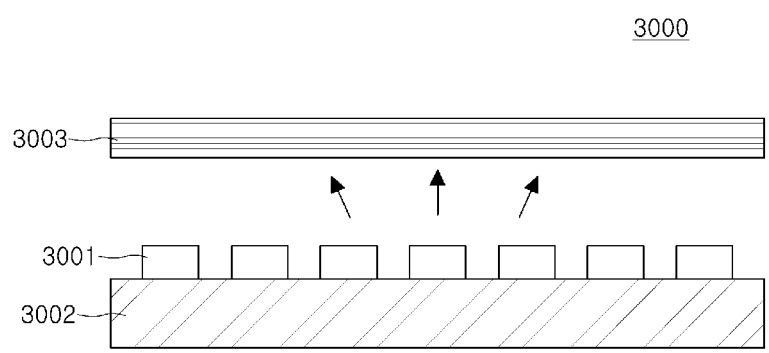
FIGS. 14 and 15 are views each illustrating examples of applying the semiconductor light emitting device according to the exemplary embodiment of the present disclosure to a backlight unit.
Figure 15:
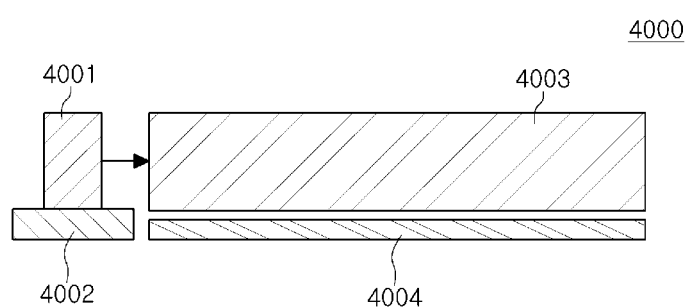

FIGS. 14 and 15 are views each illustrating an example of applying the semiconductor light emitting device according to the exemplary embodiment of the present disclosure to a backlight unit.

Referring to FIG. 14, a backlight unit 3000 includes one or more light source(s) 3001 mounted on a substrate 3002 and at least one optical sheet 3003 disposed thereabove. Each light source 3001 may be a semiconductor light emitting device package having the above-described structure, with reference to FIGS. 12 and 13 or a structure similar thereto. Alternatively, one or more of the semiconductor light emitting devices of FIGS. 1 to 8 and 10 may be directly mounted on the substrate 3002 (in a so called chip-on-board (COB) type mounting).

The light source 3001 in the backlight unit 3000 of FIG. 14 emits light toward a liquid crystal display (LCD) device disposed thereabove. On the other hand, a light source 4001 mounted on a substrate 4002 in a backlight unit 4000 according to another embodiment illustrated in FIG. 15 emits light laterally and the emitted light is incident to a light guide plate 4003 such that the backlight unit 4000 may serve as a surface light source. The light that has passed through the light guide plate 4003 may be emitted upwardly and a reflective layer 4004 may be formed under a bottom surface of the light guide plate 4003 in order to improve light extraction efficiency.

Figure 16:
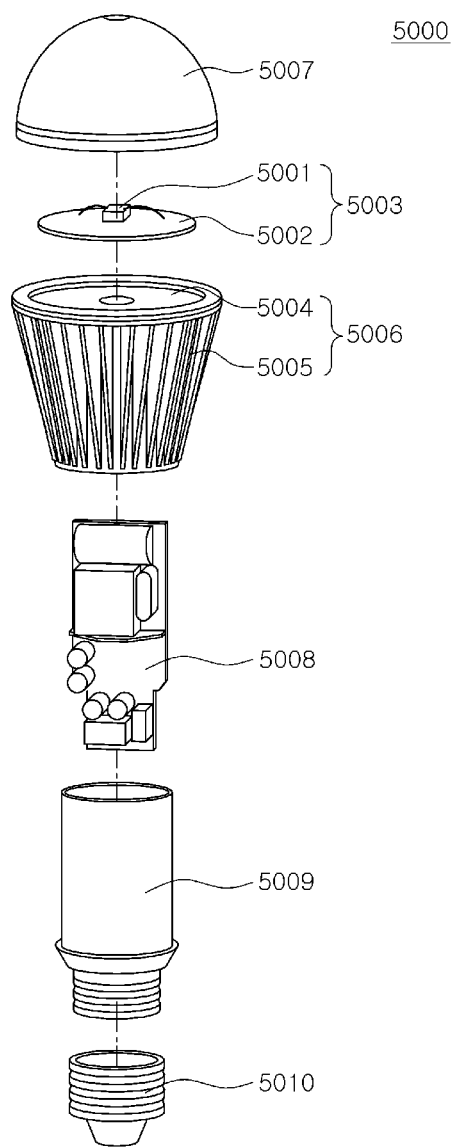
FIG. 16 is a view illustrating an example of applying the semiconductor light emitting device according to the exemplary embodiment of the present disclosure to a lighting device.

FIG. 16 is a view illustrating an example of applying the semiconductor light emitting device according to the exemplary embodiment of the present disclosure to a lighting device.

Referring to an exploded perspective view of FIG. 16, a lighting device 5000 is exemplified as a bulb-type lamp, and includes a light emitting module 5003, a driving unit 5008, and an external connector unit 5010. In addition, exterior structures such as an external housing 5006, an internal housing 5009, a cover unit 5007, and the like may be additionally included. The light emitting module 5003 may include a light source 5001 having the same structure as or a structure similar to that of the semiconductor light emitting device package above-described with reference to FIGS. 12 and 13 and a circuit board 5002 having the light source 5001 mounted thereon. The embodiment illustrates the case in which a single light source 5001 is mounted on the circuit board 5002; however, if necessary, a plurality of light sources may be mounted thereon.

The external housing 5006 may serve as a heat radiating part, and include a heat sink plate 5004 in direct contact with the light emitting module 5003 to improve the dissipation of heat and heat radiating fins 5005 covering a lateral surface of the lighting device 5000. The cover unit 5007 may be disposed above the light emitting module 5003 and may have a convex lens shape. The driving unit 5008 may be disposed inside the internal housing 5009 and may be connected to the external connector unit 5010 such as a socket structure to receive power from an external power source. In addition, the driving unit 5008 may convert the received power into a current source appropriate for driving the light source 5001 of the light emitting module 5003 and supply the converted current source thereto. For example, the driving unit 5008 may be configured of an AC-DC converter, a rectifying circuit part, or the like.

Further, although not illustrated in the drawings, the lighting device 5000 may further include a communications module.

Figure 17:
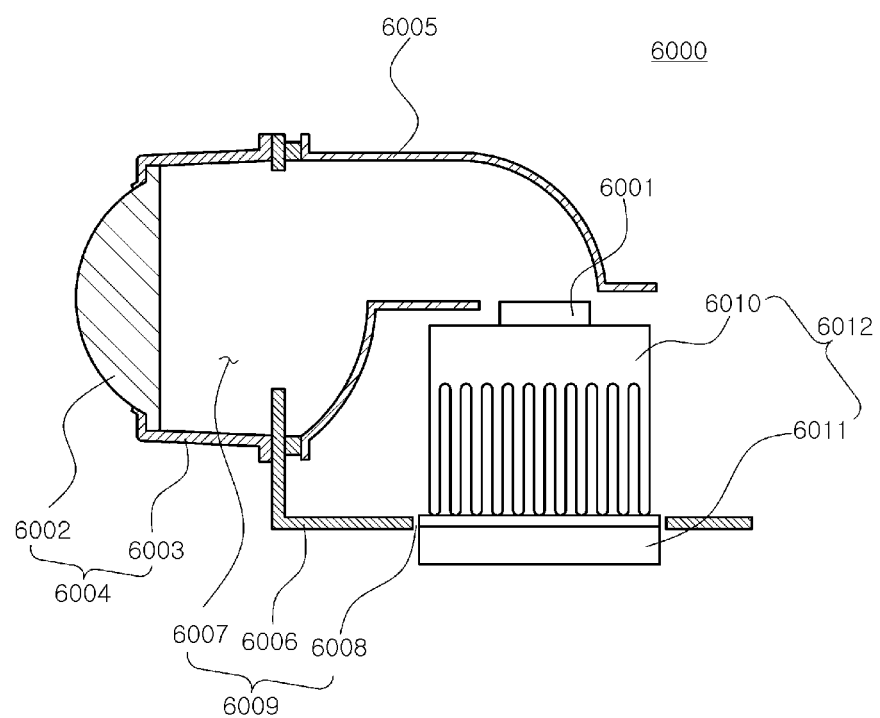
FIG. 17 is a view illustrating an example of applying the semiconductor light emitting device according to the exemplary embodiment of the present disclosure to a headlamp.

FIG. 17 is a view illustrating an example of applying the semiconductor light emitting device according to the exemplary embodiment of the present disclosure to a headlamp.

Referring to FIG. 17, a headlamp 6000 used as a vehicle lighting element or the like may include a light source 6001, a reflective unit 6005, and a lens cover unit 6004, the lens cover unit 6004 including a hollow guide part 6003 and a lens 6002. The light source 6001 may include at least one of the semiconductor light emitting device packages of FIGS. 12 and 13.

The headlamp 6000 may further include a heat radiating unit 6012 dissipating heat generated by the light source 6001 outwardly. The heat radiating unit 6012 may include a heat sink 6010 and a cooling fan 6011 in order to effectively dissipate heat. In addition, the headlamp 6000 may further include a housing 6009 allowing the heat radiating unit 6012 and the reflective unit 6005 to be fixed thereto and supported thereby. One surface of the housing 6009 may be provided with a central hole 6008 into which the heat radiating unit 6012 is inserted to be coupled thereto.

The other surface of the housing 6009 integrally connected to and bent in a direction perpendicular to one surface of the housing 6009 may be provided with a forward hole 6007 such that the reflective unit 6005 may be disposed above the light source 6001. Accordingly, a forward side may be opened by the reflective unit 6005 and the reflective unit 6005 may be fixed to the housing 6009 such that the opened forward side corresponds to the forward hole 6007, whereby light reflected by the reflective unit 6005 disposed above the light source 6001 may pass through the forward hole 6007 to be emitted outwardly.

As set forth above, according to exemplary embodiments of the present disclosure, a semiconductor light emitting device having improved light extraction efficiency may be provided.

While exemplary embodiments have been shown and described above, it will be apparent to those skilled in the art that modifications and variations could be made without departing from the spirit and scope of the present disclosure as defined by the appended claims.

What is claimed is:

1. A semiconductor light emitting device, comprising:
   a light emitting structure including a first conductivity type semiconductor layer, an active layer, and a second conductivity type semiconductor layer sequentially stacked therein; and
   first and second electrodes electrically connected to the first and second conductivity type semiconductor layers, respectively,
   wherein the second electrode includes:
      a current blocking layer disposed in a region of an upper surface of the second conductivity type semiconductor layer;
      a reflective part disposed on the current blocking layer;
      a transparent electrode layer spaced apart from the reflective part, having an opening surrounding the reflective part, and disposed on the second conductivity type semiconductor layer;
      a pad electrode part spaced apart from the transparent electrode layer while covering the reflective part, and disposed within a region of the current blocking layer; and
      at least one finger electrode part extending from the pad electrode part in one direction and having at least one portion thereof disposed on the transparent electrode layer.

2. The semiconductor light emitting device of claim 1, wherein at least one portion of the transparent electrode layer comes into contact with the current blocking layer.

3. The semiconductor light emitting device of claim 1, wherein the pad electrode part is spaced apart from a lateral surface of the opening in the transparent electrode layer by a predetermined distance.

4. The semiconductor light emitting device of claim 1, further comprising:
   a connection part electrically connecting the pad electrode part and the transparent electrode layer.

5. The semiconductor light emitting device of claim 4, wherein the connection part has a predetermined length, and one end of the connection part is disposed on the transparent electrode layer while the other end of the connection part is disposed on the pad electrode part.

6. The semiconductor light emitting device of claim 4, wherein the connection part is spaced apart from the finger electrode part adjacent thereto so as to extend from a point of the pad electrode part that is diametrically opposite from a point of the pad electrode part from which the at least one finger electrode part extends.

7. The semiconductor light emitting device of claim 4, wherein the connection part is one of a plurality of connection parts each electrically connecting the pad electrode part and the transparent electrode layer.

8. The semiconductor light emitting device of claim 7, wherein the connection parts of the plurality of connection parts and the at least one finger electrode part extend from respective points disposed evenly along the periphery of the pad electrode part.

9. The semiconductor light emitting device of claim 8, wherein the plurality of connection parts and the at least one finger electrode part are disposed in a radial manner around the pad electrode part.

10. The semiconductor light emitting device of claim 4, wherein the connection part has a length shorter than a length of the at least one finger electrode part.

11. The semiconductor light emitting device of claim 1, wherein the current blocking layer is formed of at least one selected from a group consisting of $SiO_2$, SiN, $Al_2O_3$, HfO, $TiO_2$, and ZrO.

12. The semiconductor light emitting device of claim 1, wherein the reflective part is formed of at least one selected from a group consisting of Ag, Al, Rh, and Ir.

13. The semiconductor light emitting device of claim 1, wherein the transparent electrode layer is formed of at least one selected from a group consisting of indium tin oxide (ITO), zinc-doped indium tin oxide (ZITO), zinc indium oxide (ZIO), gallium indium oxide (GIO), zinc tin oxide (ZTO), fluorine-doped tin oxide (FTO), aluminum-doped zinc oxide (AZO), gallium-doped zinc oxide (GZO), $In_4Sn_3O_{12}$, and $Zn_{(1-x)}Mg_xO$ (Zinc Magnesium Oxide, $0 \leq x \leq 1$).

14. The semiconductor light emitting device of claim 1, wherein the pad electrode part and the at least one finger electrode part are formed of at least one selected from a group consisting of Au, W, Pt, Si, Ir, Ag, Cu, Ni, Ti, Cr, and Al.

15. A semiconductor light emitting device, comprising:
a light emitting structure including a first conductivity type semiconductor layer, an active layer, and a second conductivity type semiconductor layer sequentially stacked therein; and
first and second electrodes electrically connected to the first and second conductivity type semiconductor layers, respectively,
wherein the first electrode includes a plurality of first finger electrode parts disposed in a portion of an upper surface of the first conductivity type semiconductor layer on which the active layer and the second conductivity type semiconductor layer are not disposed, and
wherein the second electrode includes:
a current blocking layer disposed in a region of an upper surface of the second conductivity type semiconductor layer;
a reflective part disposed on the current blocking layer;
a transparent electrode layer spaced apart from the reflective part, having an opening surrounding the reflective part, and disposed on the second conductivity type semiconductor layer;
a pad electrode part spaced apart from the transparent electrode layer while covering the reflective part, and disposed within a region of the current blocking layer; and
at least one second finger electrode part extending from the pad electrode part, having at least one portion thereof disposed on the transparent electrode layer, and extending between the first finger electrode parts of the plurality of first finger electrode parts.

16. The semiconductor light emitting device of claim 15, wherein the transparent electrode layer is spaced apart from the current blocking layer, and the opening in the transparent electrode layer surrounds the current blocking layer.

17. The semiconductor light emitting device of claim 15, wherein the plurality of first finger electrode parts and the at least one second finger electrode part each have an elongated shape that extends in parallel to one another.

* * * * *